(12) United States Patent
Ishima et al.

(10) Patent No.: US 12,362,078 B2
(45) Date of Patent: Jul. 15, 2025

(54) PHOTOSENSITIVE CONDUCTIVE PASTE, LAMINATED ELECTRONIC COMPONENT, AND METHOD OF MANUFACTURING LAMINATED ELECTRONIC COMPONENT

(71) Applicant: TDK CORPORATION, Tokyo (JP)

(72) Inventors: Yuya Ishima, Tokyo (JP); Masaki Takahashi, Tokyo (JP); Akira Suda, Tokyo (JP); Takashi Suzuki, Tokyo (JP); Hidenobu Umeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 525 days.

(21) Appl. No.: 17/230,521

(22) Filed: Apr. 14, 2021

(65) Prior Publication Data

US 2021/0327606 A1 Oct. 21, 2021

(30) Foreign Application Priority Data

Apr. 16, 2020 (JP) ................................. 2020-073424

(51) Int. Cl.
| | |
|---|---|
| *H01F 27/28* | (2006.01) |
| *G03F 7/004* | (2006.01) |
| *H01B 1/22* | (2006.01) |
| *H01F 41/04* | (2006.01) |

(52) U.S. Cl.
CPC ............ *H01B 1/22* (2013.01); *G03F 7/0047* (2013.01); *H01F 27/2804* (2013.01); *H01F 41/041* (2013.01); *H01F 2027/2809* (2013.01)

(58) Field of Classification Search
CPC ..... H01B 1/22; G03F 7/0047; H01F 27/2804; H01F 41/041; H01F 2027/2809; H01F 17/04; H01F 17/0013; H01F 27/292; H01F 41/042; G03G 9/0825; G03G 5/08214
USPC .................................................. 336/200, 232
See application file for complete search history.

(56) References Cited

U.S. PATENT DOCUMENTS

| | | | | |
|---|---|---|---|---|
| 6,225,245 | B1 * | 5/2001 | Utsunomiya | ........... C03B 19/09 65/17.2 |
| 2001/0033219 | A1 | 10/2001 | Iha et al. | |
| 2004/0161375 | A1 * | 8/2004 | Katsuro | .............. C03B 19/1065 423/338 |
| 2005/0089794 | A1 * | 4/2005 | Fukushima | .............. H01J 11/22 430/270.1 |
| 2010/0000465 | A1 * | 1/2010 | Kishi | .................... C03B 19/095 65/33.1 |
| 2014/0295351 | A1 | 10/2014 | Kubota | |

(Continued)

FOREIGN PATENT DOCUMENTS

| | | | |
|---|---|---|---|
| CN | 102634245 A | * | 8/2012 |
| CN | 103917917 A | | 7/2014 |

(Continued)

*Primary Examiner* — Shawki S Ismail
*Assistant Examiner* — Kazi S Hossain
(74) *Attorney, Agent, or Firm* — Oliff PLC

(57) ABSTRACT

In a photosensitive conductive paste containing photosensitive organic components, conductor powder, and quartz powder, melting of the quartz powder does not occur or is very unlikely to occur in a heat treatment step, and in the heat treatment step, it functions sufficiently to bring shrinkage rates and shrinkage behaviors of both of a conductor layer and an element body layer closer to each other when they shrink, and thus generation of voids can be inhibited when it is used for manufacturing a laminated coil component.

11 Claims, 9 Drawing Sheets

(56) References Cited

U.S. PATENT DOCUMENTS

| | | | |
|---|---|---|---|
| 2015/0372171 A1* | 12/2015 | Wang | C03C 8/16 |
| | | | 252/514 |
| 2016/0122511 A1* | 5/2016 | Bienmueller | B29C 49/0005 |
| | | | 264/572 |
| 2017/0236611 A1 | 8/2017 | Kondo et al. | |
| 2018/0240591 A1* | 8/2018 | Ishima | H01F 17/0013 |
| 2018/0254145 A1 | 9/2018 | Ishima et al. | |
| 2019/0013130 A1 | 1/2019 | Hamano et al. | |
| 2019/0189333 A1* | 6/2019 | Kido | H01F 27/2804 |

FOREIGN PATENT DOCUMENTS

| | | |
|---|---|---|
| CN | 107003605 A | 8/2017 |
| CN | 108538570 A | 9/2018 |
| JP | H5-331355 A | 12/1993 |
| JP | H07-082041 A | 3/1995 |
| JP | 2000-077807 A | 3/2000 |
| JP | 2001-216839 A | 8/2001 |
| JP | 2001-264965 A | 9/2001 |
| JP | 2005-244183 A | 9/2005 |
| JP | 2006-237438 A | 9/2006 |
| JP | 2013-068887 A | 4/2013 |
| JP | 2019-016727 A | 1/2019 |

\* cited by examiner

Glass

PHOTOSENSITIVE CONDUCTIVE PASTE, LAMINATED ELECTRONIC COMPONENT, AND METHOD OF MANUFACTURING LAMINATED ELECTRONIC COMPONENT

CROSS-REFERENCE TO RELATED APPLICATIONS

This application is based upon and claims the benefit of priority from Japanese Patent Application No. 2020-73424, filed on 16 Apr. 2020, the entire contents of which are incorporated herein by reference.

TECHNICAL FIELD

The present disclosure relates to a photosensitive conductive paste, a laminated electronic component, and a method of manufacturing the same.

BACKGROUND

Conventionally, a technique for forming a conductor pattern for a laminated electronic component by a photolithography method using a photosensitive conductive paste is known. Japanese Unexamined Patent Publication No. 2001-264965 discloses a photosensitive conductive paste to which glass powder is added as an inorganic additive component.

SUMMARY

The inventors have repeatedly studied inorganic additive components added to a photosensitive conductive paste and have obtained the finding that, by adding an inorganic additive component, it is possible to adjust a difference in shrinkage rate and a difference in shrinkage behavior between an element body of a laminated electronic component and a conductor pattern. However, in a photosensitive conductive paste to which glass powder is added as an inorganic additive component, glass is softened during a heat treatment in a manufacturing process, which may generate voids between the element body and the conductor pattern.

According to the present disclosure, a photosensitive conductive paste in which generation of voids is inhibited, a laminated electronic component, and a method of manufacturing the same are provided.

A photosensitive conductive paste according to one aspect of the present disclosure contains photosensitive organic components, conductor powder, and quartz powder.

Since a melting point of quartz is higher than a heat treatment temperature when the laminated electronic component is manufactured, melting of the quartz powder is unlikely to occur in the above photosensitive conductive paste, so that generation of voids when it is used in manufacturing the laminated electronic component can be inhibited.

In a photosensitive conductive paste according to another aspect, a median diameter of the quartz powder is 0.4 to 5.0 μm.

In a photosensitive conductive paste according to another aspect, a median diameter of the conductor powder is equal to or larger than the median diameter of the quartz powder.

In a photosensitive conductive paste according to another aspect, the conductor powder is silver powder.

A laminated electronic component according to one aspect of the present disclosure has a laminated structure including a plurality of element body layers having lacking portions having a rectangular cross-section, and a plurality of conductor layers filled into respective lacking portions of the plurality of element body layers, in which each of the conductor layers is configured of a conductor containing quartz powder.

In the above-mentioned laminated electronic component, the conductor layers contain the quartz powder, melting thereof during a heat treatment during manufacture is inhibited, and a situation in which voids are generated between the element body layers and the conductor layers is inhibited.

In a laminated electronic component according to another aspect, the plurality of conductor layers form a coil.

In a laminated electronic component according to another aspect, the element body layers are made of a material containing glass components.

A method of manufacturing a laminated electronic component according to one aspect of the present disclosure includes steps of: forming a laminate including a plurality of element body patterns and a plurality of conductor patterns, the plurality of element body patterns are laminated and each of the plurality of element body patterns has a lacking portion having a rectangular cross-section, the plurality of conductor patterns are filled into respective lacking portions of the plurality of element body patterns; and performing heat treatment on the laminate to make the element body patterns into element body layers and the conductor patterns into conductor layers, in which the conductor patterns are formed by photolithography using a photosensitive conductive paste containing photosensitive organic components, conductor powder, and quartz powder.

In the method of manufacturing the laminated electronic component, since the quartz powder added to the photosensitive conductive paste is difficult to melt in the heat treatment step, generation of voids between the element body layers and the conductor layers is inhibited.

DETAILED DESCRIPTION

Figure 1:
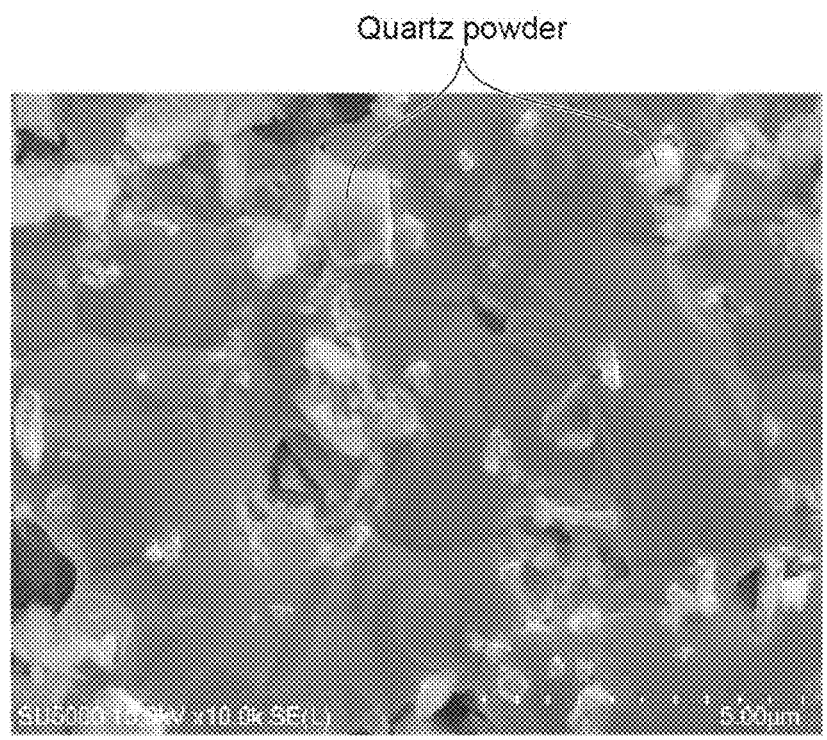
FIG. 1 is an electron microscope photograph of a photosensitive conductive paste according to a first embodiment after heat treatment.

Hereinafter, embodiments of the present disclosure will be described in detail with reference to the accompanying drawings. In the description, the same reference numerals will be used for the same elements or elements having the same function, and repeated description thereof will be omitted.

First Embodiment (Photosensitive Conductive Paste)

A photosensitive conductive paste according to a first embodiment contains conductor powder as a conductive component and quartz powder as an inorganic additive component in a photosensitive organic component. More specifically, in the photosensitive conductive paste, the conductor powder and the quartz powder are dispersed in the photosensitive organic component. The photosensitive conductive paste does not contain glass as an inorganic additive component.

The photosensitive organic component of the photosensitive conductive paste contains an organic binder and an organic solvent and may further include, for example, a photopolymerizable monomer or a photopolymerization initiator. The photosensitive organic component may be either a negative type or a positive type.

The conductor powder is a metal powder such as silver powder or an alloy powder. In the present embodiment, the conductor powder is silver powder. In the present embodiment, the silver powder has a median diameter (a d50 particle diameter) of 0.5 to 5.0 μm (2.5 μm as an example).

The quartz powder is a fine powder (i.e. silica sand) composed of quartz and is obtained by, for example, pulverization. In the present embodiment, the quartz powder has a median diameter (a d50 particle size) of 0.4 to 5.0 μm. In the present embodiment, the median diameter of the silver powder is equal to or larger than the median diameter of the quartz powder. The quartz powder may have a d95 particle size of 1.0 to 7.0 μm. The quartz powder may have a maximum particle size of 2.0 to 10 μm. As an example, the quartz powder has a median diameter of 1.0 μm, a d95 particle size of 2.0 μm, and a maximum particle size of 5.0 μm. In a case in which the quartz powder is too fine, a thickness (a reaction film thickness) to which light reaches and a photopolymerization reaction occurs when the photosensitive conductive paste is dried and formed into a film deteriorates, and thus the quartz powder is required to have a larger particle size to some extent. The quartz powder is added at a ratio of about 0.5 to 2.5 wt % with respect to the silver powder. By adjusting the addition ratio of the quartz powder, a shrinkage rate when the photosensitive conductive paste is heat-treated is adjusted. For example, by increasing the addition ratio of the quartz powder, the shrinkage rate (a final shrinkage rate) can be lowered, and a difference in shrinkage rate between a conductor layer and an element body layer in a laminated electronic component, which will be described later, can be reduced. Further, by adjusting the addition ratio of the quartz powder, a behavior (a shrinkage behavior) of the element body layer from the start of shrinkage to the end of shrinkage can be brought close to a shrinkage behavior of the conductor layer. By bringing the shrinkage rates and the shrinkage behaviors of the conductor layer and the element body layer closer to each other, voids generated in the vicinity of an interface between the conductor layer and the element body layer due to the differences in shrinkage rate and shrinkage behavior can be inhibited.

As shown in FIG. 1, the quartz powder has a shape having a plurality of corner portions (or sharp edge portions) and has, for example, a polygonal cross-section. The quartz powder retains its shape without melting if it is heat-treated at a temperature lower than the melting point of quartz (about 1600 to 1700° C.). In a case in which the quartz powder does not melt, the quartz powder does not agglomerate and maintains a dispersed state even after the heat treatment.

Further, since the quartz powder allows sufficient light transmission (UV transmission), the quartz powder does not interfere with exposure when the photosensitive conductive paste is exposed in a photolithography method.

(Laminated Coil Component)

Figure 2:
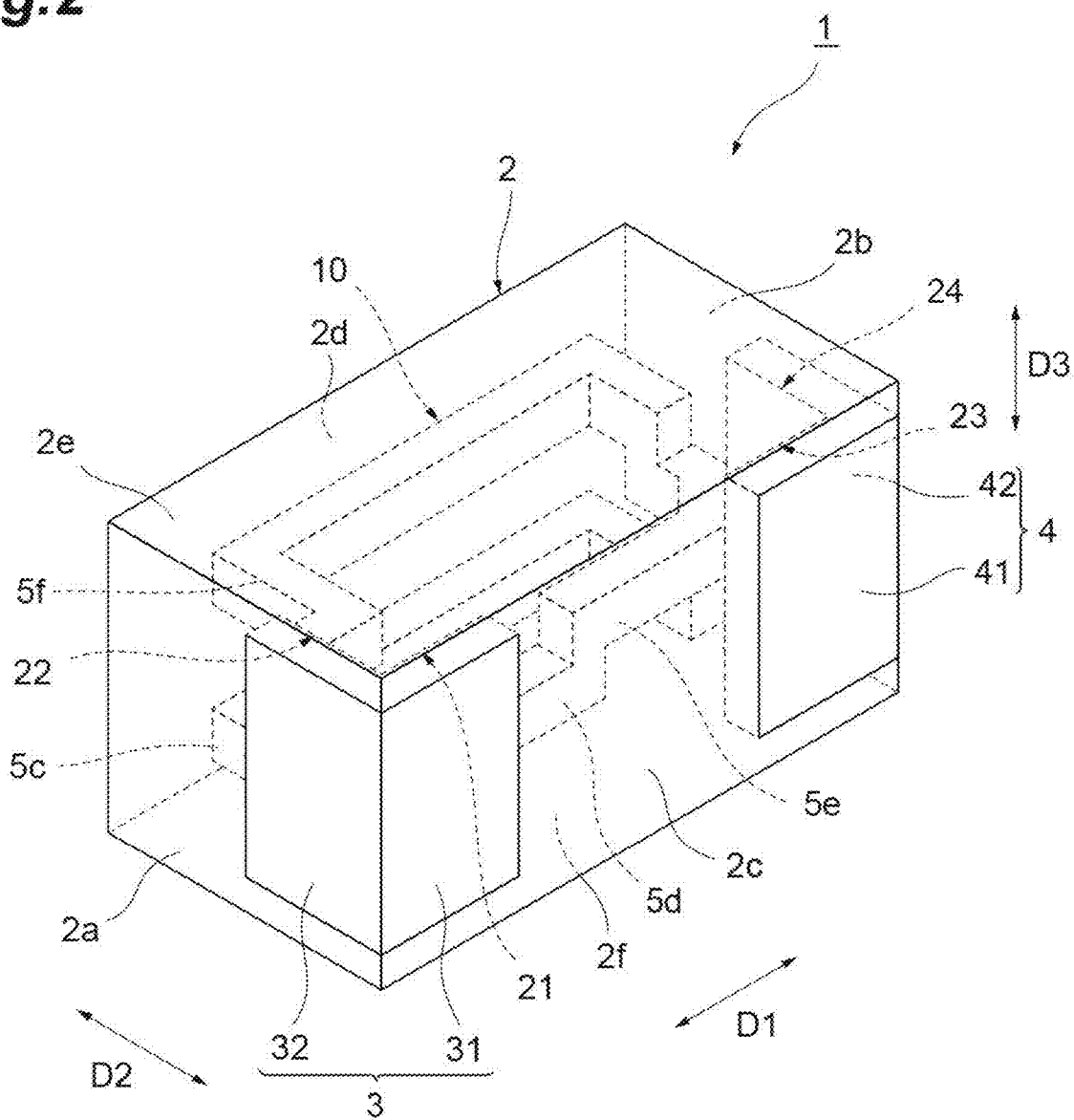
FIG. 2 is a perspective view of a laminated coil component manufactured by a method of manufacturing the laminated coil component according to the first embodiment.
Figure 3:
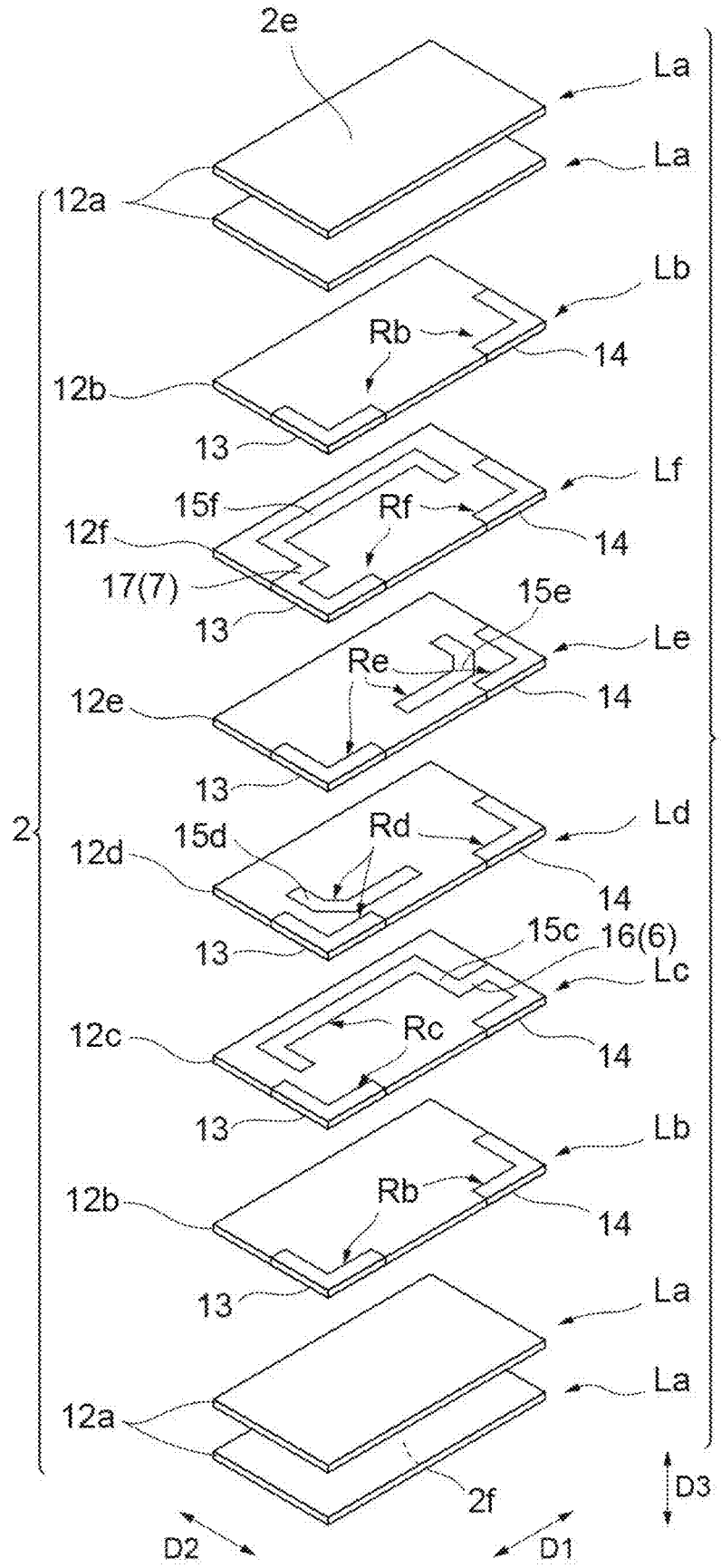
FIG. 3 is an exploded perspective view of the laminated coil component shown in FIG. 1.

The laminated coil component according to the first embodiment will be described with reference to FIGS. 2 and 3. FIG. 2 is a perspective view of the laminated coil component manufactured by a method of manufacturing the laminated coil component according to the first embodiment. FIG. 3 is an exploded perspective view of the laminated coil component shown in FIG. 2.

As shown in FIGS. 2 and 3, the laminated coil component 1 according to the first embodiment includes an element body 2, mounting conductors 3 and 4, a plurality of coil conductors 5c, 5d, 5e, and 5f, and connecting conductors 6 and 7.

The element body 2 has a rectangular parallelepiped shape. The rectangular parallelepiped shape includes a rectangular parallelepiped shape in which corner portions and ridge portions are chamfered, and a rectangular parallelepiped shape in which corner portions and ridge portions are rounded. The element body 2 has end faces 2a and 2b and side surfaces 2c, 2d, 2e and 2f. The end faces 2a and 2b face each other. The side surfaces 2c and 2d face each other. The side surfaces 2e and 2f face each other. In the following, facing directions of the end faces 2a and 2b are defined as a direction D1, facing directions of the side surfaces 2c and 2d are defined as a direction D2, and facing directions of the side surfaces 2e and 2f are defined as a direction D3. The direction D1, direction D2, and direction D3 are substantially orthogonal to each other.

The end faces 2a and 2b extend in the direction D2 to connect the side surfaces 2c and 2d. The end faces 2a and 2b also extend in the direction D3 to connect the side surfaces 2e and 2f. The side surfaces 2c and 2d extend in the direction D1 to connect the end faces 2a and 2b. The side surfaces 2c and 2d also extend in the direction D3 to connect the side surfaces 2e and 2f. The side surfaces 2e and 2f extend in the direction D2 to connect the side surfaces 2c and 2d. The side surfaces 2e and 2f also extend in the direction D1 to connect the end faces 2a and 2b.

The side surface 2c is a mounting surface and is a surface facing another electronic device (for example, a circuit base material or an electronic component) (not shown) when, for example, the laminated coil component 1 is mounted on another electronic device. The end faces 2a and 2b are faces continuous from the mounting surface (that is, the side surface 2c).

A length of the element body 2 in the direction D1 is longer than a length of the element body 2 in the direction D2 and a length of the element body 2 in the direction D3. The length of the element body 2 in the direction D2 and the length of the element body 2 in the direction D3 are equivalent to each other. That is, in the present embodiment, the end faces 2a and 2b have square shapes, and the side surfaces 2c, 2d, 2e and 2f have rectangular shapes. The length of the element body 2 in the direction D1 may be equal to or shorter than the length of the element body 2 in the direction D2 and the length of the element body 2 in the direction D3. The length of the element body 2 in the direction D2 and the length of the element body 2 in the direction D3 may be different from each other.

Also, in the present embodiment, "equivalent" may indicate "equal," and in addition, a value including a slight difference or a manufacturing error in a preset range may be equivalent. For example, if a plurality of values are included within the range of ±5% of an average value of the plurality of values, it is defined that the plurality of values are equivalent.

The element body 2 is provided with recessed portions 21, 22, 23, and 24. The recessed portions 21 and 22 are provided integrally with each other and correspond to the mounting conductor 3. The recessed portions 23 and 24 are provided integrally with each other and correspond to the mounting conductor 4.

The recessed portion 21 is provided on the end face 2a side of the side surface 2c and is recessed toward the side surface 2d. The recessed portion 22 is provided on the side surface 2c side of the end face 2a and is recessed toward the end face 2b. The recessed portion 23 is provided on the end face 2b side of the side surface 2c and is recessed toward the side surface 2d. The recessed portion 24 is provided on the side surface 2c side of the end face 2b and is recessed toward the end face 2a. The recessed portions 21, 22, 23, and 24 have the same shape, for example. The recessed portions 21, 22, 23, and 24 are provided apart from the side surfaces 2d, 2e, and 2f. The recessed portion 21 and the recessed portion 23 are provided apart from each other in the direction D1.

The element body 2 is formed by laminating a plurality of element body layers 12a to 12f in the direction D3. A specific laminated structure will be described later. In the actual element body 2, the plurality of element body layers 12a to 12f are integrated with each other to the extent that boundaries between the layers cannot be visually recognized. The element body layers 12a to 12f are made of, for example, a magnetic material (a Ni—Cu—Zn-based ferrite material, a Ni—Cu—Zn—Mn-based ferrite material, a Ni—Cu-based ferrite material, or the like). The magnetic material constituting the element body layers 12a to 12f may contain an Fe alloy or the like. The element body layers 12a to 12f may contain a glass material or may be made of a non-magnetic material (a glass ceramic material, a dielectric material, or the like).

The mounting conductor 3 is disposed in the recessed portions 21 and 22. The mounting conductor 4 is disposed in the recessed portions 23 and 24. The mounting conductors 3 and 4 are separated from each other in the direction D1. The mounting conductors 3 and 4 have, for example, the same shape. The mounting conductors 3 and 4 have, for example, an L-shaped cross-section. It can be said that the mounting conductors 3 and 4 have an L shape when viewed in the direction D3, for example. The mounting conductors 3 and 4 may be electroplated or electroless plated to form plating layers on outer surfaces thereof. The plating layers contain, for example, Cu, Ni, Sn, Au and the like.

The mounting conductor 3 is formed by laminating a plurality of mounting conductor layers 13 in the direction D3, which have an L shape when viewed in the direction D3. In the actual mounting conductor 3, the plurality of mounting conductor layers 13 are integrated to the extent that boundaries between the layers cannot be visually recognized. The mounting conductor 3 has conductor portions 31 and 32 that are integrally formed. The conductor portions 31 and 32 have substantially rectangular plate shapes. The conductor portions 31 and 32 have the same shape, for example. The conductor portion 31 is disposed in the recessed portion 21. The conductor portion 32 is disposed in the recessed portion 22.

The mounting conductor 4 is formed by laminating a plurality of mounting conductor layers 14 in the direction D3, which have an L shape when viewed in the direction D3. In the actual mounting conductor 4, the plurality of mounting conductor layers 14 are integrated to the extent that boundaries between the layers cannot be visually recognized. The mounting conductor 4 has conductor portions 41 and 42 that are integrally formed. The conductor portions 41 and 42 have substantially rectangular plate shapes. The conductor portions 41 and 42 have the same shape, for example. The conductor portion 41 is disposed in the recessed portion 23. The conductor portion 42 is disposed in the recessed portion 24.

The plurality of coil conductors 5c, 5d, 5e, and 5f are connected to each other to form a coil 10 in the element body 2. The coil conductors 5c, 5d, 5e, and 5f are disposed such that they at least partially overlap each other when viewed in the direction D3. The coil conductors 5c, 5d, 5e, and 5f are disposed apart from the end faces 2a and 2b and the side surfaces 2c, 2d, 2e, and 2f.

The coil conductor 5c forms one end portion of the coil 10. One end portion of the coil conductor 5c and the connecting conductor 6 are adjacent to each other in the direction D1 and are connected to each other. The other end portion of the coil conductor 5c and one end portion of the coil conductor 5d are adjacent to each other in the direction D3 and are connected to each other. The other end portion of the coil conductor 5d and one end portion of the coil conductor 5e are adjacent to each other in the direction D3 and are connected to each other. The other end portion of the coil conductor 5e and one end portion of the coil conductor 5f are adjacent to each other in the direction D3 and are connected to each other. The other end portion of the coil conductor 5f and the connecting conductor 7 are adjacent to each other in the direction D1 and are connected to each other.

The coil conductors 5c, 5d, 5e, and 5f are formed by laminating a plurality of coil conductor layers 15c, 15d, 15e, and 15f in the direction D3. That is, the plurality of coil conductor layers 15c, 15d, 15e, and 15f are disposed so that they all overlap each other when viewed in the direction D3. The coil conductors 5c, 5d, 5e, and 5f may be configured of one coil conductor layer 15c, 15d, 15e, and 15f. Also, FIG. 3 shows only one coil conductor layer 15c, 15d, 15e, 15f. In the actual coil conductors 5c, 5d, 5e, and 5f, the plurality of coil conductor layers 15c, 15d, 15e, and 15f are integrated to the extent that boundaries between the layers cannot be visually recognized.

The connecting conductor 6 extends in the direction D1 and is connected to the coil conductor 5c of the coil 10 and the conductor portion 42. The connecting conductor 7 extends in the direction D1 and is connected to the coil conductor 5f and the conductor portion 32. The connecting conductors 6 and 7 are formed by laminating a plurality of connecting conductor layers 16 and 17 in the direction D3. Also, FIG. 3 shows only one connecting conductor layer 16 and 17. In the actual connecting conductors 6 and 7, the plurality of connecting conductor layers 16 and 17 are integrated to the extent that boundaries between the layers cannot be visually recognized.

The mounting conductor layers 13 and 14, the coil conductor layers 15c, 15d, 15e, and 15f, and the connecting conductor layers 16 and 17 described above are configured of conductors containing silver and quartz powder. Each of these layers may be made of the same material or may be made of different materials. Each of these layers has a rectangular cross-section. Further, the "rectangular cross-section" of the present embodiment indicates that a shape of a cross-section of a portion extending in a predetermined direction when cut at a plane orthogonal to the direction is rectangular. Also, the "rectangular" of the present embodiment is not limited to a shape (of a rectangle or a square) which is surrounded by four straight lines and in which all four corners are right angles, opposing straight lines do not have to be parallel as long as it has a substantially rectangular outline, and a part or all of a straight line may be curved, corners may not be right angles, or corners may be rounded.

The laminated coil component 1 includes a plurality of layers La, Lb, Lc, Ld, Le, and Lf. The laminated coil component 1 is formed by laminating, for example, two layers of La, one layer of Lb, three layers of Lc, three layers of Ld, three layers of Le, three layers of Lf, one layer of Lb, and two layers La in order from the side surface 2f side. Also, in FIG. 3, one layer is shown for each of the three layers Lc, the three layers Ld, the three layers Le, and the three layers Lf, and the other two are omitted.

The layer La is configured of the element body layer 12a.

The layer Lb is formed by combining the element body layer 12b and the mounting conductor layers 13 and 14 with each other. The element body layer 12b is provided with lacking portions Rb which have shapes corresponding to the shapes of the mounting conductor layers 13 and 14 and are filled with the mounting conductor layers 13 and 14. The element body layer 12b and the entire mounting conductor layers 13 and 14 have a complementary relationship with each other.

The layer Lc is formed by combining the element body layer 12c, the mounting conductor layers 13 and 14, and the coil conductor layer 15c with each other. The element body layer 12c is provided with lacking portions Rc which have shapes corresponding to the shapes of the mounting conductor layers 13 and 14 and the coil conductor layer 15c and are filled with the mounting conductor layers 13 and 14, the coil conductor layer 15c, and the connecting conductor layer 16. The element body layer 12c, and the entire mounting conductor layers 13 and 14, the coil conductor layer 15c and the connecting conductor layer 16 have a complementary relationship with each other.

The layer Ld is formed by combining the element body layer 12d, the mounting conductor layers 13 and 14, and the coil conductor layer 15d with each other. The element body layer 12d is provided with lacking portions Rd which have shapes corresponding to the shapes of the mounting conductor layers 13 and 14 and the coil conductor layer 15d and are filled with the mounting conductor layers 13 and 14 and the coil conductor layer 15d. The element body layer 12d, and the entire mounting conductor layers 13 and 14 and the coil conductor layer 15d have a complementary relationship with each other.

The layer Le is formed by combining the element body layer 12e, the mounting conductor layers 13 and 14, and the coil conductor layer 15e with each other. The element body layer 12e is provided with lacking portions Re which have shapes corresponding to the shapes of the mounting conductor layers 13 and 14 and the coil conductor layer 15e and are filled with the mounting conductor layers 13 and 14 and the coil conductor layer 15e. The element body layer 12e, and the entire mounting conductor layers 13 and 14 and the coil conductor layer 15e have a complementary relationship with each other.

The layer Lf is formed by combining the element body layer 12f, the mounting conductor layers 13 and 14, the coil conductor layer 15f, and the connecting conductor layer 17 with each other. The element body layer 12f is provided with lacking portions Rf which have shapes corresponding to the shapes of the mounting conductor layers 13 and 14, the coil conductor layer 15f, and the connecting conductor layer 17 and are filled with the mounting conductor layers 13 and 14, the coil conductor layer 15f and the connecting conductor layer 17. The element body layer 12f, and the entire mounting conductor layers 13 and 14, the coil conductor layer 15f, and the connecting conductor layer 17 have a complementary relationship with each other.

The lacking portions Rb, Rc, Rd, Re, and Rf are integrated to form the above-mentioned recessed portions 21, 22, 23, and 24. Widths of the lacking portions Rb, Rc, Rd, Re, and Rf (hereinafter, the width of the lacking portion) are basically set to be wider than widths of the mounting conductor layers 13 and 14, the coil conductor layers 15c, 15d, 15e, and 15f, and the connecting conductor layers 16 and 17 (hereinafter, the width of the conductor portion). In order to improve adhesiveness between the element body layers 12b, 12c, 12d, 12e, and 12f, the mounting conductor layers 13 and 14, the coil conductor layers 15c, 15d, 15e, and 15f, and the connecting conductor layers 16 and 17, the width of the lacking portion may be intentionally set to be narrower than the width of the conductor portion. A value obtained by subtracting the width of the conductor portion from the width of the lacking portion may be, for example, −3 µm or more and 10 µm or less, or 0 µm or more and 10 µm or less.

(Method of Manufacturing Laminated Coil Component)

Figure 4:
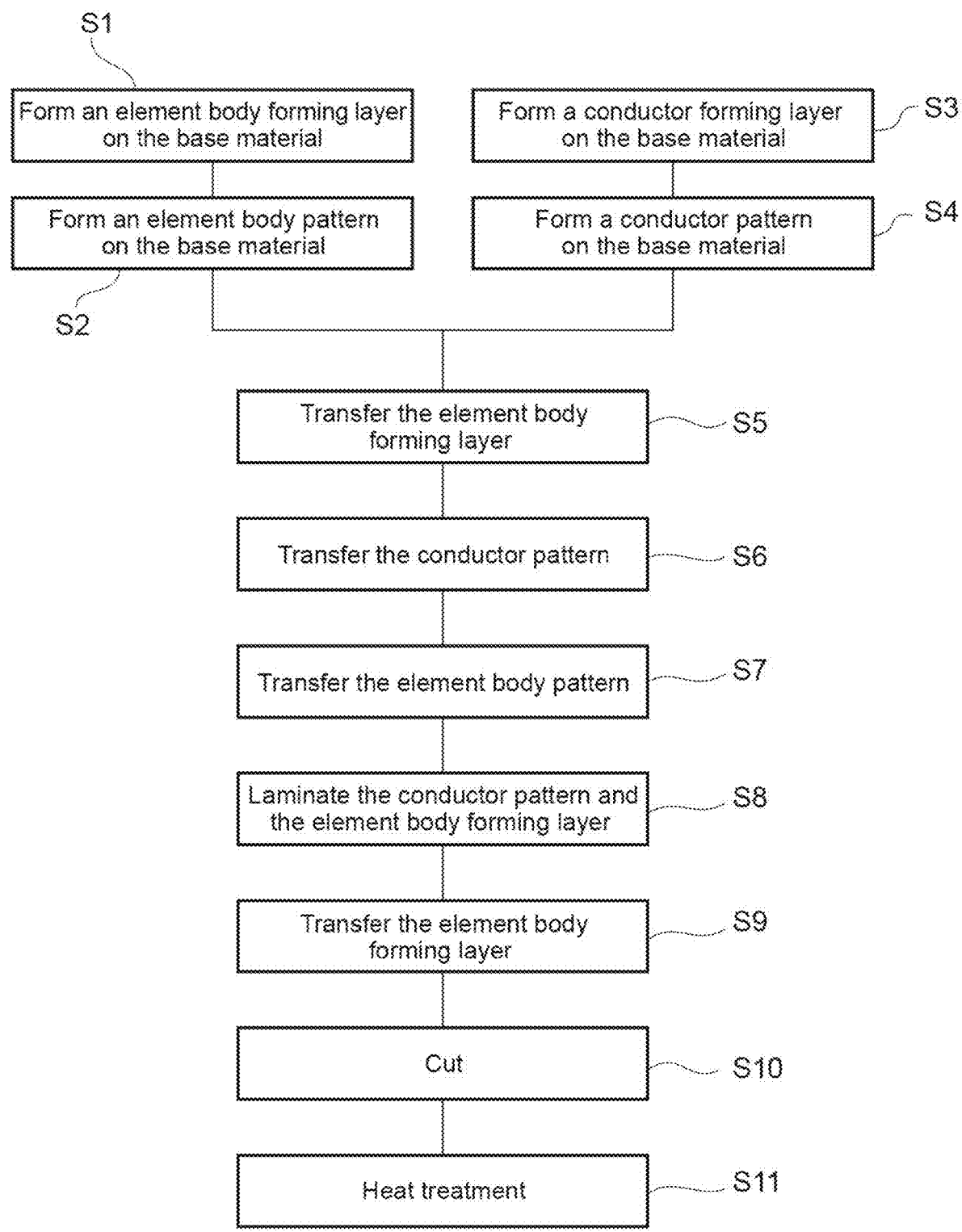
FIG. 4 is a flowchart showing the method of manufacturing the laminated coil component according to the first embodiment.

A method of manufacturing the laminated coil component 1 according to the embodiment will be described with reference to FIGS. 4, 5A to 5G, and 6A and 6B. FIG. 4 is a flowchart showing the method of manufacturing the laminated coil component according to the first embodiment. FIGS. 5A to 5G, and 6A and 6B are cross-sectional views conceptually showing the method of manufacturing the laminated coil component according to the first embodiment. The cross-sectional views of FIGS. 5A to 5G, and 6A and 6B are conceptually shown and do not necessarily coincide with actual cross-sectional views of the laminated coil component 1.

Figure 5A:
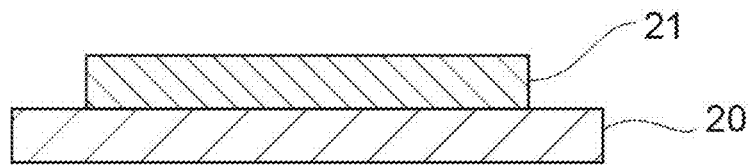
FIGS. 5A to 5G are cross-sectional views conceptually showing the method of manufacturing the laminated coil component according to the first embodiment.

First, as shown in FIG. 5A, an element body forming layer 21 is formed on a base material 20 (step S1). The base material 20 is, for example, a PET film. The element body forming layer 21 is formed, for example, by applying an element body paste containing a photosensitive organic component to which the above-mentioned constituent materials of the element body layers 12a to 12f are added onto the base material 20. The photosensitive organic component contained in the element body paste may be either a negative type or a positive type, and known ones can be used.

Figure 5B:
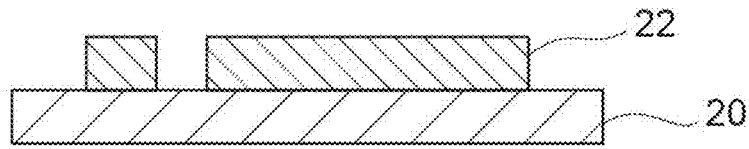

Subsequently, as shown in FIG. 5B, the element body forming layer 21 is exposed and developed by, for example, a photolithography method using a Cr mask, and an element body pattern 22 from which a shape corresponding to a shape of a conductor pattern 32, which will be described later, is removed is formed on the base material 20 (step S2). The element body pattern 22 is a layer that becomes the element body layers 12b to 12f after heat treatment. That is, in step S2, the element body pattern 22 provided with a lacking portion 23 that will become the lacking portion Rc, Rd, Re, and Rf is formed. Also, the "photolithography method" of the present embodiment may be any method of exposing and developing a processing target layer containing the photosensitive organic component to process it into a desired pattern and is limited by a type of mask or the like.

Figure 5C:
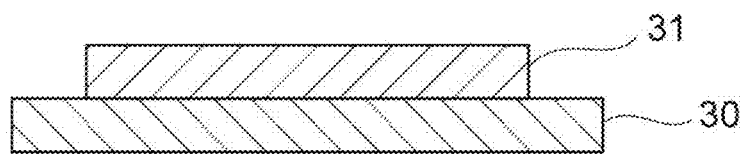
Figure 5D:

On the other hand, as shown in FIG. 5C, a conductor forming layer 31 is formed on the base material 30 (step S3). The base material 30 is, for example, a PET film. The conductor forming layer 31 is formed by applying the above-mentioned photosensitive conductor paste on the base material 30. Subsequently, as shown in FIG. 5D, the conductor forming layer 31 is exposed and developed by, for example, a photolithography method using a Cr mask, and the conductor pattern 32 is formed on the base material 30 (step S4). The conductor pattern 32 is a layer that will become the mounting conductor layers 13 and 14, the coil conductor layers 15c, 15d, 15e, and 15f, and the connecting conductor layers 16 and 17 after heat treatment.

Figure 5E:
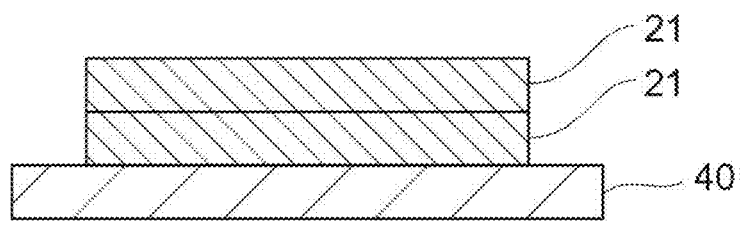

Subsequently, as shown in FIG. 5E, the element body forming layer 21 formed in the above step S1 is transferred from the base material 20 onto a support 40 (step S5). By repeating the step S5 a plurality of times, a plurality of element body forming layers 21 may be laminated on the support 40. In the present embodiment, two layers of the element body forming layer 21 are laminated on the support 40 by repeating the step S5 twice. These element body forming layers 21 are layers that will become the layer La after heat treatment.

Figure 5F:
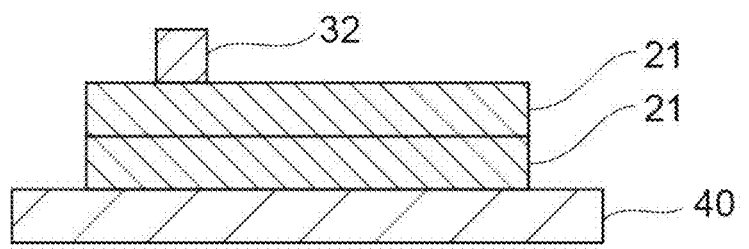
Figure 5G:
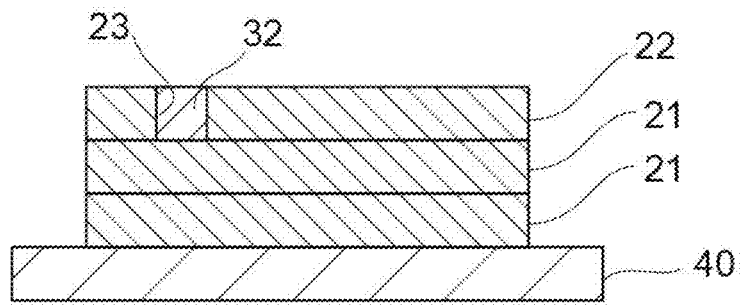

Subsequently, by repeatedly transferring the conductor pattern 32 and the element body pattern 22 onto the support 40, the conductor pattern 32 and the element body pattern 22 are laminated in the direction D3. Specifically, first, as shown in FIG. 5F, the conductor pattern 32 formed in the above step S4 is transferred from the base material 30 onto the element body forming layer 21 transferred in the above step S5 (step S6). Next, as shown in FIG. 5G, the element body pattern 22 formed in the above step S2 is transferred from the base material 20 onto the element body forming layer 21 transferred in the above step S5 (step S7). The lacking portion 23 of the element body pattern 22 is filled with the conductor pattern 32 transferred onto the element body forming layer 21 in the above step S6, and the element body pattern 22 and the conductor pattern 32 become the same layer.

Figure 6A:
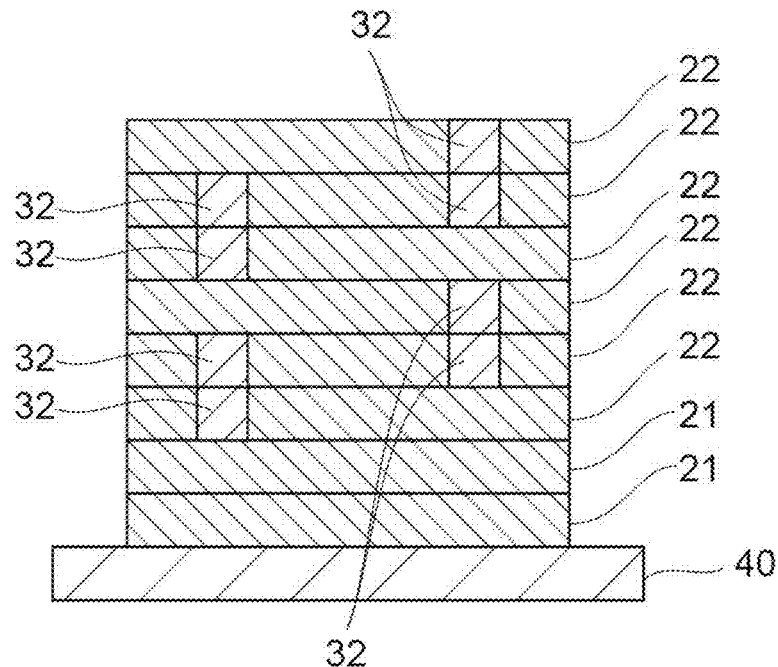
FIGS. 6A and 6B are cross-sectional views conceptually showing the method of manufacturing a laminated coil component according to the first embodiment.
Figure 6B:
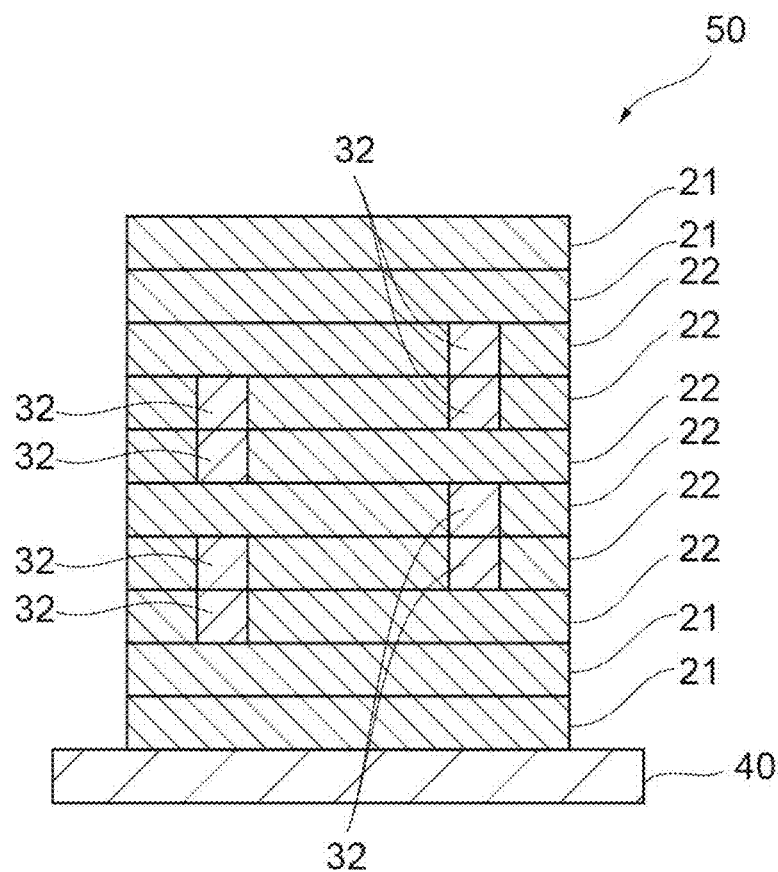

Further, as shown in FIG. 6A, the above steps S6 and S7 are repeatedly carried out, and the element body pattern 22 and the conductor pattern 32 are laminated in a state in which they are combined with each other (step S8). Thus, the layers Lb, Lc, Ld, Le, and Lf are laminated after heat treatment. Also, in the step S8, it is not always necessary to repeat the step S6 and the step S7 on a one-to-one basis, and for example, the step S6 may be repeated more than the step S7. Thus, for example, the conductor pattern 32 corresponding only to the mounting conductor layers 13 and 14 may be extra-transferred to the element body pattern 22. Subsequently, as shown in FIG. 6B, the element body forming layer 21 formed in the above step S1 is transferred from the base material 20 onto the layer laminated in the above step S8 (step S9). By repeating the step S9 a plurality of times, a plurality of element body forming layers 21 may be laminated on the layer. In the present embodiment, two layers of the base material 20 and the element body forming layer 21 are laminated on the layer by repeating the step twice. These element body forming layers 21 are layers that will become the layer La after heat treatment.

As described above, a laminate 50 constituting the laminated coil component 1 is formed on the support 40 after heat treatment. In addition, for example, a layer provided with a cutting mark or a mark indicating directionality of a chip (the laminated coil component 1) or a colored layer may be further laminated as necessary to form the laminate 50.

Subsequently, the obtained laminate 50 is cut into a predetermined size (step S10).

Then, the cut laminate 50 is subjected to a binder removal treatment and then a heat treatment (step S11). A heat treatment temperature is, for example, about 850 to 900° C. As a result, the laminated coil component 1 is obtained. If necessary, the mounting conductors 3 and 4 may be electroplated or electroless plated.

By the heat treatment step S11, the photosensitive conductor paste becomes a conductor pattern composed of silver containing quartz powder. Not all of the quartz powder is necessarily present inside the conductor pattern, and some of the quartz powder may be partially exposed from a surface of the conductor pattern. As shown in the electron microscope photograph of FIG. 1, since the heat treatment temperature in the heat treatment step S11 is lower than the melting point of quartz, the quartz powder in the photosensitive conductor paste does not melt and its shape is maintained. Further, quartz powders are not fused with each other, and a dispersed state of the quartz powders in the photosensitive conductor paste is maintained even after the heat treatment step S11.

Figure 7:
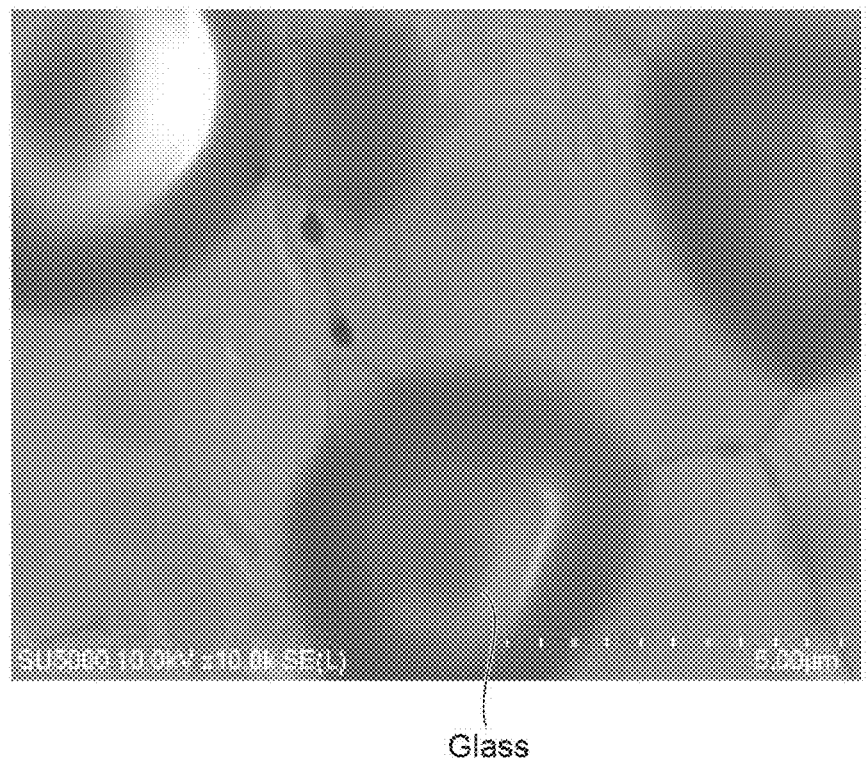
FIG. 7 is an electron microscope photograph of the photosensitive conductive paste to which glass powder has been added after heat treatment.

On the other hand, in a case in which the photosensitive conductor paste contains glass powder as an inorganic additive component, a softening point of glass (for example, about 800° C.) is lower than the melting point of quartz, and there is a risk of the heat treatment temperature in the heat treatment step S11 being higher than the softening point of glass, and in this case, as shown in FIG. 7, the glass powder in the photosensitive conductor paste is softened. In FIG. 7, a black area around glass is a phase (a heterogeneous phase) in which a glass component is solid-solved in a conductive component. A shape of glass powder is not maintained after the heat treatment step, and the glass powder is spherical. Further, as a result of the glass powder being softened, agglomeration of the glass powder also occurs, and the dispersed state of the glass powder in the photosensitive conductor paste cannot be maintained. Also, in a case in which the photosensitive conductor paste contains quartz powder as an inorganic additive component, a thickness of the heterogeneous phase at an interface with the conductive component is narrow to be 10 μm or less and may be 6 μm or less.

Subsequently, if necessary, the mounting conductors 3 and 4 are electroplated or electroless plated to form a plating layer on outer surfaces of the mounting conductors 3 and 4. As a result, the laminated coil component 1 is obtained.

As described above, in the photosensitive conductor paste according to the present embodiment, melting of the quartz powder does not occur or is very unlikely to occur in the heat treatment step S11, and in the heat treatment step S11, it functions sufficiently to bring shrinkage rates and shrinkage behaviors of both the conductor layer and the element body layer closer to each other when they shrink, and thus generation of voids can be inhibited when it is used for manufacturing the laminated coil component 1.

In the present embodiment, since the element body pattern and the conductor pattern are both formed using a photolithography method, the element body pattern and the conductor pattern can be formed more accurately, for example, than in a case of a printing method.

Second Embodiment

Figure 8:
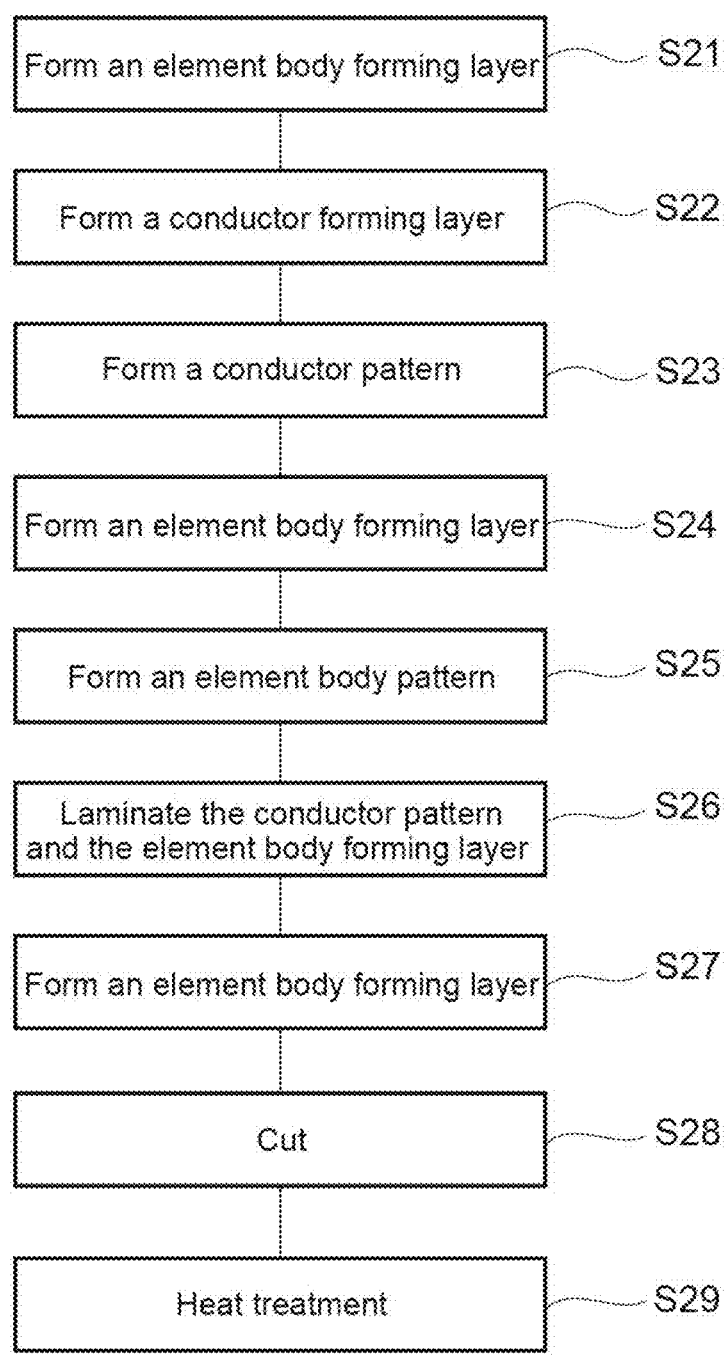
FIG. 8 is a flowchart showing a method of manufacturing a laminated coil component according to a second embodiment.

A method of manufacturing the laminated coil component 1 according to a second embodiment will be described with reference to FIGS. 8 and 9A to 9E. FIG. 8 is a flowchart showing the method of manufacturing the laminated coil component according to the second embodiment. FIGS. 9A to 9E are cross-sectional views conceptually showing the method of manufacturing the laminated coil component according to the second embodiment. The cross-sectional views of FIGS. 9A to 9E are conceptually shown and do not necessarily coincide with actual cross-sectional views of the laminated coil component 1. Also, the laminated coil component 1 manufactured using the manufacturing method according to the second embodiment and the laminated coil component 1 manufactured using the manufacturing method according to the first embodiment have the same configuration.

Figure 9A:
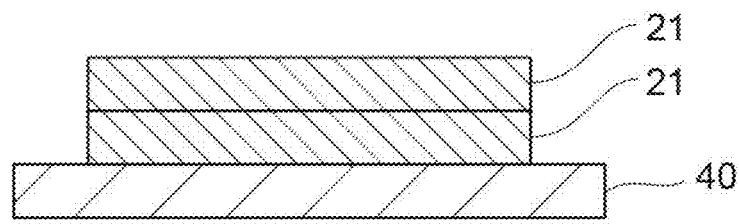
FIGS. 9A to 9E are cross-sectional views conceptually showing the method of manufacturing the laminated coil component according to the second embodiment.

In the manufacturing method according to the second embodiment, first, as shown in FIG. 9A, the element body forming layer 21 is formed on the support 40 (step S21). The element body forming layer 21 is formed, for example, by applying an element body paste to a surface of the support 40. In the present embodiment, the element body forming layer 21 is laminated in two layers by performing the step S21 twice. These element body forming layers 21 are layers that will become the layer La after heat treatment.

Figure 9B:
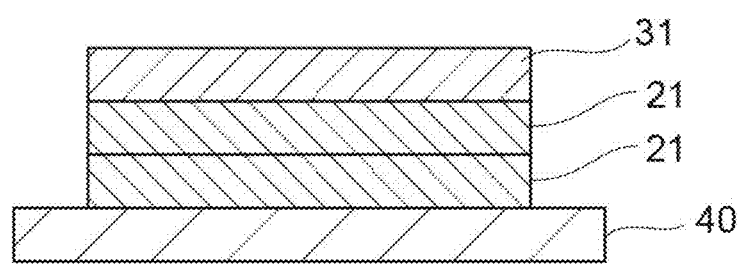
Figure 9C:
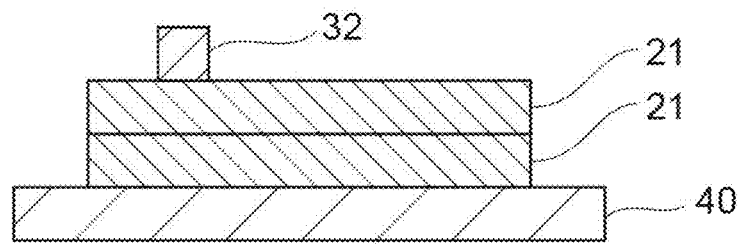

Subsequently, as shown in FIG. 9B, the conductor forming layer 31 is formed on the element body forming layer 21 (step S22). The conductor forming layer 31 is formed by applying the above-mentioned photosensitive conductor paste on the element body forming layer 21. Then, as shown in FIG. 9C, the conductor forming layer 31 is exposed and developed by, for example, a photolithography method using a Cr mask, and the conductor pattern 32 is formed on the element body forming layer 21 (step S23). The conductor pattern 32 is a layer that will become the mounting conductor layers 13 and 14, the coil conductor layers 15c, 15d, 15e, and 15f, and the connecting conductor layers 16 and 17 after heat treatment.

Figure 9D:
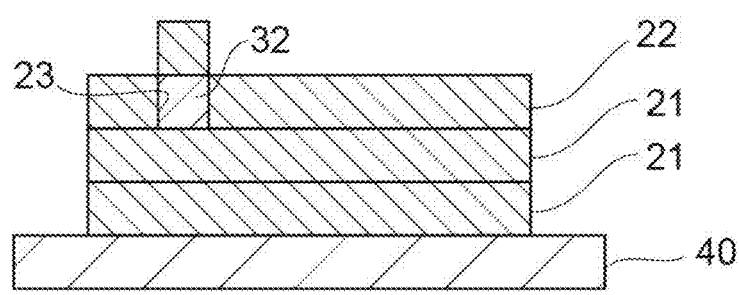

Next, as shown in FIG. 9D, a new element body forming layer 21 is formed on the element body forming layer 21 to cover the conductor pattern 32 provided on the element body forming layer 21 (step S24). The newly formed element body forming layer 21 is formed to fill a periphery of the conductor pattern 32.

Figure 9E:
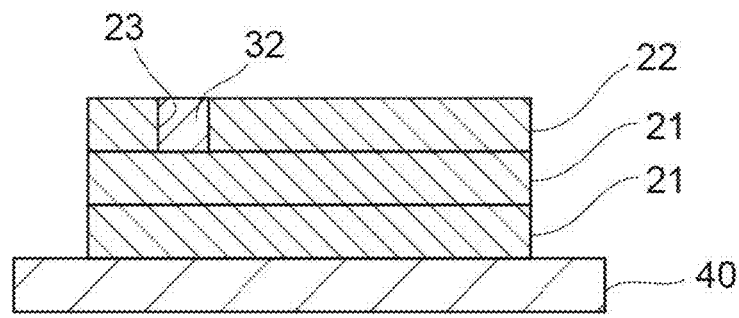

Then, as shown in FIG. 9E, the newly formed element body forming layer 21 is patterned by, for example, a photolithography method using a Cr mask (step S25). The lacking portion 23 of the element body pattern 22 is filled with the conductor pattern 32 formed in the above step S23, and the element body pattern 22 and the conductor pattern 32 become the same layer.

Subsequently, the above steps S22 and S23 and steps S24 and S25 are repeatedly carried out, and the element body pattern 22 and the conductor pattern 32 are laminated in a state in which they are combined with each other as in the configuration shown in FIG. 6A (step S26). Also, in the above step S26, the steps S22 and S23, and the steps S24 and S25 do not necessarily have to be repeated one-to-one basis, and for example, the steps S22 and S23 may be repeated more than the steps S24 and S25. Thus, for example, the conductor pattern 32 corresponding only to the mounting conductor layers 13 and 14 may be extra-transferred to the element body pattern 22. Subsequently, in order to have the configuration shown in FIG. 6B, a new element body forming layer 21 is formed on the layer laminated in the above step S26 (step S27). By repeating the step S27 a plurality of times, a plurality of element body forming layers 21 may be laminated on the layer. In the present embodiment, two layers of the base material 20 and the element body forming layer 21 are laminated on the layer by repeating the step twice. These element body forming layers 21 are layers that will become the layer La after heat treatment.

As described above, the laminate 50 constituting the laminated coil component 1 is formed on the support 40 after heat treatment. Subsequently, as in the first embodiment, the obtained laminate 50 is cut into a predetermined size (step S28), and the cut laminate 50 is subjected to a binder removal treatment and then a heat treatment (step S29). As a result, the laminated coil component 1 is obtained.

As described above, since the photosensitive conductor paste is also used in the second embodiment as in the first embodiment, melting of the quartz powder does not occur or is very unlikely to occur in the heat treatment step S29, and in the heat treatment step S29, it functions sufficiently to bring the shrinkage rates and the shrinkage behaviors of both of the conductor layer and the element body layer closer to each other when they shrink, and thus generation of voids can be inhibited when it is used for manufacturing the laminated coil component 1.

The present disclosure is not limited to the above-described embodiments, and various modifications can be made.

The element body pattern and the conductor pattern may be formed by, for example, a printing method, not a photolithography method. The element body pattern and the conductor pattern do not necessarily have to be formed on different base materials and may be formed on a common base material as long as the element body pattern and the conductor pattern are separated from each other.

In the first embodiment and the second embodiment described above, the laminated coil component 1 has been described as an example of the laminated electronic component, but the present disclosure is not limited thereto and is also applicable to a method of manufacturing other electronic components such as a multilayer ceramic capacitor, a laminated varistor, a laminated piezoelectric actuator, a laminated thermistor, or a laminated composite component.

What is claimed is:

1. A photosensitive conductive paste comprising photosensitive organic components, conductor powder, and quartz powder,
    wherein the quartz powder has a melting point of about 1600 to 1700° C.,
    wherein the photosensitive conductive paste is free of glass powder, and
    wherein a median diameter of the conductor powder is larger than a median diameter of the quartz powder.

2. The photosensitive conductive paste according to claim 1, wherein the median diameter of the quartz powder is 0.4 to 5.0 μm.

3. The photosensitive conductive paste according to claim 1, wherein the conductor powder is silver powder.

4. A laminated electronic component comprising a laminated structure including a plurality of element body layers having lacking portions having a rectangular cross-section, and a plurality of conductor layers filled into respective lacking portions of the plurality of element body layers,
    wherein each of the conductor layers is configured of a conductor containing quartz powder, wherein the quartz powder has a melting point of about 1600 to 1700° C., wherein the conductor is free of glass powder, and wherein a median diameter of the conductor powder is larger than a median diameter of the quartz powder.

5. The laminated electronic component according to claim 4, wherein the plurality of conductor layers form a coil.

6. The laminated electronic component according to claim 4, wherein the element body layers are made of a material containing glass components.

7. The photosensitive conductive paste according to claim 1, wherein the quartz powder has a d95 particle size of 1.0 to 7.0 μm.

8. The photosensitive conductive paste according to claim 1, wherein the quartz powder has a maximum particle size of 2.0 to 10 μm.

9. The photosensitive conductive paste according to claim 1, wherein the quartz powder is added at a ratio of about 0.5 to 2.5 wt % with respect to the silver powder.

10. The laminated electronic component according to claim 4, wherein the quartz powder has a d95 particle size of 1.0 to 7.0 μm.

11. The laminated electronic component according to claim 4, wherein the quartz powder has a maximum particle size of 2.0 to 10 μm.

\* \* \* \* \*